US012811087B2

(12) United States Patent
Nishitani et al.

(10) Patent No.: US 12,811,087 B2
(45) Date of Patent: Nov. 24, 2026

(54) ELECTRON GUN, ELECTRON RAY APPLYING DEVICE, AND ELECTRON BEAM PROJECTING METHOD

(71) Applicant: PHOTO ELECTRON SOUL INC., Aichi (JP)

(72) Inventors: Tomohiro Nishitani, Aichi (JP); Daiki Sato, Aichi (JP)

(73) Assignee: Photo electron Soul Inc., Nagoya (JP)

( * ) Notice: Subject to any disclaimer, the term of this patent is extended or adjusted under 35 U.S.C. 154(b) by 473 days.

(21) Appl. No.: 17/996,215

(22) PCT Filed: Mar. 30, 2021

(86) PCT No.: PCT/JP2021/013455
§ 371 (c)(1),
(2) Date: Oct. 13, 2022

(87) PCT Pub. No.: WO2021/210382
PCT Pub. Date: Oct. 21, 2021

(65) Prior Publication Data

US 2023/0230794 A1 Jul. 20, 2023

(30) Foreign Application Priority Data

Apr. 16, 2020 (JP) ................................ 2020-073311

(51) Int. Cl.
*H01J 37/073* (2006.01)

(52) U.S. Cl.
CPC ... *H01J 37/073* (2013.01); *H01J 2237/06333* (2013.01); *H01J 2237/0653* (2013.01); *H01J 2237/30472* (2013.01)

(58) Field of Classification Search
None
See application file for complete search history.

(56) References Cited

U.S. PATENT DOCUMENTS 3,594,583 A * 7/1971 Sheldon ................. G01H 9/002 250/363.01
3,885,194 A * 5/1975 Schumacher ......... H01J 37/242 315/117

(Continued)

FOREIGN PATENT DOCUMENTS

CN 102484024 A 5/2012
EP 3780063 A1 2/2021

(Continued)

OTHER PUBLICATIONS

English machine translation for JP-H09298032-A (Year: 1997).*

(Continued)

*Primary Examiner* — Michael J Logie
*Assistant Examiner* — Alina Kaliszewski
(74) *Attorney, Agent, or Firm* — INTELLECTUAL PROPERTY LAW GROUP LLP

(57) ABSTRACT

An object is to provide an electron gun that can extend the lifetime of a photocathode. The object can be achieved by an electron gun including: a substrate having a photocathode film formed on a first face; a light source for irradiating the photocathode film with excitation light; an anode; a heater device for heating the photocathode film and/or the substrate; and an output adjustment device that adjusts a heating temperature of the heater device.

3 Claims, 5 Drawing Sheets

(56) References Cited

U.S. PATENT DOCUMENTS

| | | | | | |
|---|---|---|---|---|---|
| 4,476,392 | A * | 10/1984 | Young | H01J 49/08 250/423 P |
| 4,709,185 | A * | 11/1987 | Hoeberechts | H01J 1/34 313/550 |
| 4,820,927 | A * | 4/1989 | Langner | H01J 37/073 850/16 |
| 4,970,392 | A * | 11/1990 | Oettinger | H01J 1/34 313/542 |
| 5,684,360 | A * | 11/1997 | Baum | G03F 7/70375 313/530 |
| 6,005,247 | A * | 12/1999 | Baum | H01J 37/073 250/397 |
| 6,296,976 | B1 * | 10/2001 | Groves | B82Y 40/00 430/30 |
| 7,095,037 | B2 * | 8/2006 | Fernadez | B82Y 10/00 313/530 |
| 7,455,565 | B2 * | 11/2008 | Machuca | H01J 37/073 445/35 |
| 7,576,320 | B2 * | 8/2009 | Bunker | H01J 40/06 250/423 P |
| 8,298,029 | B2 * | 10/2012 | Mulhollan | H01J 9/505 250/492.24 |
| 9,006,678 | B2 * | 4/2015 | Ivashin | H01J 31/04 250/423 R |
| 11,251,011 | B2 * | 2/2022 | Ohshima | H01J 37/22 |
| 2001/0001226 | A1 * | 5/2001 | Nihashi | H01J 1/34 313/542 |
| 2004/0094755 | A1 * | 5/2004 | Hirohata | H01J 1/34 257/10 |
| 2004/0108812 | A1 * | 6/2004 | Janaway | H01J 37/073 313/542 |
| 2005/0205775 | A1 * | 9/2005 | Bromberg | G01N 27/622 250/294 |
| 2006/0170324 | A1 * | 8/2006 | Machuca | H01J 1/34 313/364 |
| 2013/0187058 | A1 * | 7/2013 | Swanson | H01J 37/00 250/395 |
| 2014/0055025 | A1 * | 2/2014 | Yasuda | H01J 37/26 313/364 |
| 2014/0131574 | A1 * | 5/2014 | Zewail | H01J 37/073 250/311 |
| 2015/0187541 | A1 | 7/2015 | Dinu-Gurtler et al. | |
| 2016/0172144 | A1 | 6/2016 | Nishitani | |
| 2021/0035766 | A1 | 2/2021 | Nishitani et al. | |
| 2022/0181111 | A1 * | 6/2022 | Shikano | H01J 1/88 |
| 2023/0131413 | A1 * | 4/2023 | Koizumi | H01J 3/08 250/310 |

FOREIGN PATENT DOCUMENTS

| | | | | |
|---|---|---|---|---|
| JP | H0714502 | A * | 1/1995 | H01J 1/34 |
| JP | H9-298032 | A | 11/1997 | |
| JP | H09298032 | A * | 11/1997 | |
| JP | 2002313273 | A * | 10/2002 | |
| JP | 3537779 | B2 | 3/2004 | |
| JP | 5186599 | B2 * | 4/2013 | H01J 37/063 |
| JP | 6578529 | B1 | 9/2019 | |
| JP | 6679014 | B1 | 4/2020 | |
| KR | 10-2014-0044310 | A | 4/2014 | |
| TW | 201142898 | A | 12/2011 | |
| TW | 201528312 | A | 7/2015 | |
| WO | WO-2011068101 | A1 * | 6/2011 | H01J 37/07 |
| WO | WO2015/008561 | A1 | 1/2015 | |
| WO | WO-2018186294 | A1 * | 10/2018 | H01J 1/94 |

OTHER PUBLICATIONS

English machine translation for WO-2018186294-A1 (Year: 2018).*
English machine translation for JP-H0714502-A (Year: 1995).*
English machine translation for JP-2002313273-A (Year: 2002).*
English machine translation for WO-2011068101-A1 (Year: 2011).*
English machine translation for JP-5186599-B2 (Year: 2013).*
International Search Report, dated Apr. 27, 2021 for corresponding International Application No. PCT/JP2021/013455 with English translation (4 pages).
Written Opinion of the ISA, dated Apr. 27, 2021 for corresponding International Application No. PCT/JP2021/013455 (7 pages).
Japan Office Action, dated May 25, 2020 for corresponding Japanese Patent Application No. 2020-073311 with English translation (12 pages).
Daiki Sato et al., "Observation of relaxation time of surface charge limit for InGaN photocathodes with negative electron affinity" Japanese Journal of Applied Physics, dated 2016 Jpn. J. Appl. Phys. 5505FH05 (5 pages).
Extended European Search Report, dated Apr. 23, 2024 for corresponding European Application No. 21787785.1 (12 pages).
Korea Office Action, dated Oct. 16, 2024 for corresponding Korean Patent Application No. 10-2022-7034416 with English translation (14 pages).
Taiwan Office Action, dated Nov. 27, 2024 for corresponding Taiwan Patent Application No. 110109912 with English translation (9 pages).
China Office Action, dated Nov. 29, 2024 for corresponding China Patent Application No. 202180026051.X with English translation (12 pages).
Korean Office Action dated Jun. 26, 2025 for the corresponding Korean Application No. 10-2022-7034416 with English translation (14 pages).

* cited by examiner

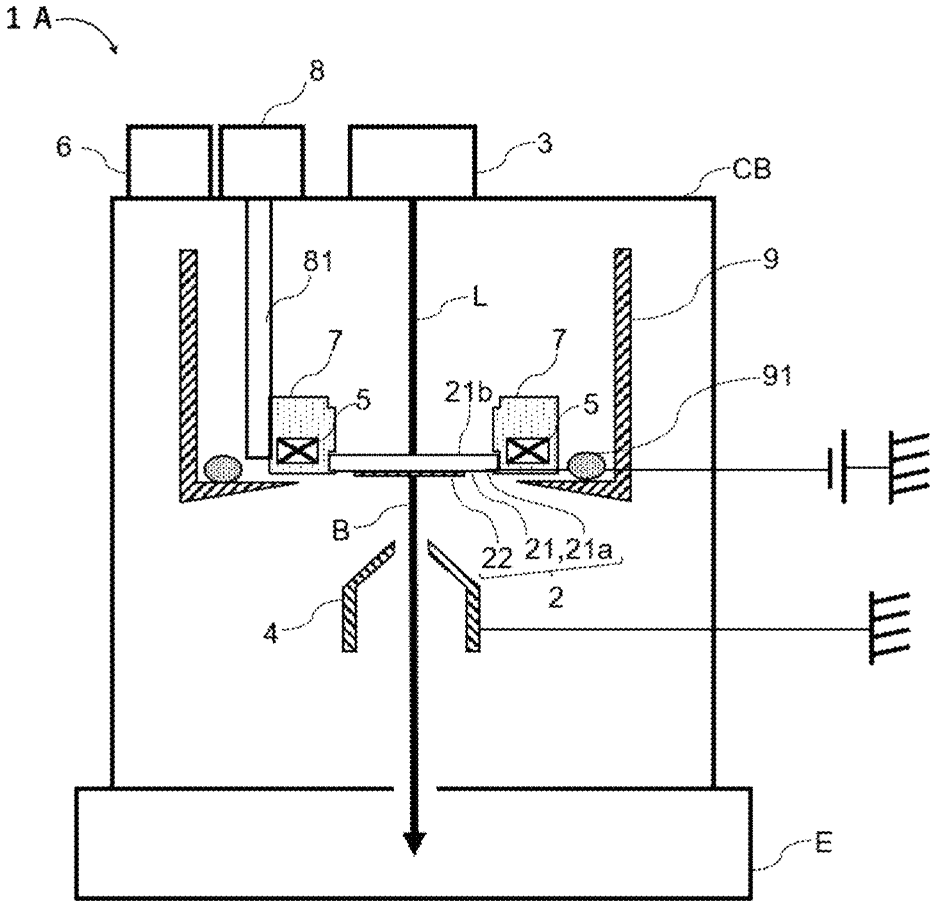
FIG. 1
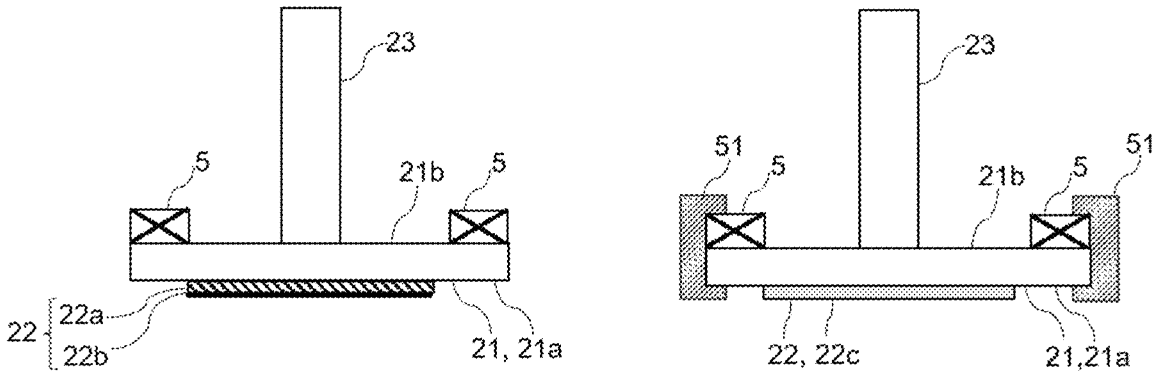
FIG. 2A
FIG. 2B

ELECTRON GUN, ELECTRON RAY APPLYING DEVICE, AND ELECTRON BEAM PROJECTING METHOD

CROSS-REFERENCE TO RELATED APPLICATIONS

This application is a U.S. National Phase application, under 35 U.S.C. § 371, of International Application no. PCT/JP2021/013455, with an international filing date of Mar. 30, 2021, and claims priority to Japanese application no. 2020-073311 filed on Apr. 16, 2020, each of which is hereby incorporated by reference for all purposes.

TECHNICAL FIELD

The disclosure in the present application relates to an electron gun, an electron beam applicator, and an emission method of an electron beam.

BACKGROUND ART

Electron guns equipped with a photocathode and electron beam applicators such as an electron microscope, a free electron laser accelerator, an inspection device, or the like including such an electron gun (hereafter, a device from which an electron gun is removed from electron beam applicators therefrom may be referred to as a "counterpart device") are known. For example, Patent Literature 1 discloses an electron microscope device with a photocathode that emits an electron beam in response to being irradiated with excitation light from a light source.

In electron beam applicators such as an electron microscope device, it is required to stably maintain emission of an electron beam. In a photocathode, however, continued light irradiation causes deterioration of electron emission characteristics and a decrease in the number of emitted electrons. Thus, in an electron beam source with such a photocathode, the intensity of an electron beam decreases over operation time. Thus, Patent Literature 1 discloses increasing the intensity of excitation light and applying deposition of Cs to recover the intensity of the electron beam.

Further, an electron gun that measures the intensity of an electron beam emitted from a photocathode by using a measuring electron beam blocked by an electron beam shield member and, in accordance with a measurement result, adjusts the intensity of the electron beam emitted from the photocathode is also known (see Patent Literature 2).

CITATION LIST

Patent Literature

Patent Literature 1: Japanese Patent Application Laid-Open No. 2002-313273

Patent Literature 2: Japanese patent No. 6578529

SUMMARY OF INVENTION

Technical Problem

As disclosed in Patent Literatures 1 and 2, it is known to recover the intensity of an electron beam by increasing the intensity of excitation light or applying redeposition of Cs when the function of a photocathode deteriorates due to continued use of the photocathode. To improve the operation rate of an electron beam applicator to which an electron gun with a photocathode is mounted, however, a lower frequency of redeposition of Cs, in other words, a longer lifetime of the photocathode is preferable. However, there is no known method for extending the lifetime of a photocathode for an electron gun with a photocathode.

The present inventors have made an intensive study and newly found that it is possible to extend the lifetime of a photocathode by causing emission of an electron beam while heating the photocathode.

Accordingly, an object of the disclosure of the present application is to provide an electron gun that can extend the lifetime of a photocathode, an electron beam applicator to which the electron gun is mounted, and an emission method of an electron beam. Other optional, additional advantageous effects of the disclosure in the present application will be apparent in embodiments of the invention.

Solution to Problem (1) An electron gun comprising:
- a substrate having a photocathode film formed on a first face;
- a light source for irradiating the photocathode film with excitation light;
- an anode;
- a heater device for heating the photocathode film and/or the substrate; and
- an output adjustment device that adjusts a heating temperature of the heater device.

(2) The electron gun according to (1) above further comprising a vacuum chamber,
- wherein the heater device is arranged inside the vacuum chamber and directly or indirectly heats the substrate.

(3) The electron gun according to (2) above further comprising a holder that holds the substrate,
- wherein the heater device is arranged to the holder.

(4) An electron gun comprising:
- a substrate having a photocathode film formed on a first face;
- a light source for irradiating the photocathode film with excitation light;
- an anode;
- a heater device for heating the photocathode film and/or the substrate; and
- a vacuum chamber,
- wherein the heater device is arranged outside the vacuum chamber and heats the photocathode film and/or the substrate from outside of the vacuum chamber.

(5) The electron gun according to (4) above further comprising an output adjustment device that adjusts a heating temperature of the heater device.

(6) The electron gun according to any one of (1) to (3) and (5) above further comprising:
- a measuring unit that measures a change in an intensity of an electron beam emitted from the photocathode film due to deterioration of the photocathode film; and
- a control unit that controls the output adjustment device in accordance with a measurement result from the measuring unit.

(7) The electron gun according to (6) above, wherein in accordance with a measurement result from the measuring unit, the control unit adjusts the intensity of the electron beam emitted from the photocathode film.

(8) An electron beam applicator including the electron gun according to any one of (1) to (7) above, wherein the electron beam applicator is:

a free electron laser accelerator,
an electron microscope,
an electron holography device,
an electron beam drawing device,
an electron diffractometer,
an electron beam inspection device,
an electron beam metal additive manufacturing device,
an electron beam lithography device,
an electron beam processing device,
an electron beam curing device,
an electron beam sterilization device,
an electron beam disinfection device,
a plasma generation device,
an atomic element generation device,
a spin-polarized electron beam generation device,
a cathodoluminescence device, or
an inverse photoemission spectroscopy device.

(9) An emission method of an electron beam,
wherein the electron beam is emitted from an electron gun including
a substrate having a photocathode film formed on a first face,
a light source for irradiating the photocathode film with excitation light,
an anode, and
a heater device for heating the photocathode film and/or the substrate,
the emission method comprising:
an electron beam emission step of irradiating the photocathode film with the excitation light from the light source while heating the photocathode film and/or the substrate and emitting an electron beam from the photocathode film in response to receiving the excitation light.

(10) The emission method according to (9) above further comprising a photocathode temperature adjustment step of adjusting a heating temperature of the photocathode film and/or the substrate.

(11) The emission method according to (10) above,
wherein the electron gun further includes a measuring unit that measures a change in an intensity of an electron beam emitted from the photocathode film due to deterioration of the photocathode film, and
wherein the photocathode temperature adjustment step is performed in accordance with a measurement result from the measuring unit.

Advantageous Effect of Invention

It is possible to extend the lifetime of a photocathode by causing emission of an electron beam while heating the photocathode.

BRIEF DESCRIPTION OF DRAWINGS

FIG. 1 is a diagram schematically illustrating an electron gun 1A according to a first embodiment and a counterpart device E to which the electron gun 1A is mounted.

FIG. 2A and FIG. 2B are diagrams illustrating other embodiments for the arrangement of a heater device 5 in the electron gun 1A according to the first embodiment.

DETAILED DESCRIPTION OF EMBODIMENTS

Figure 3:
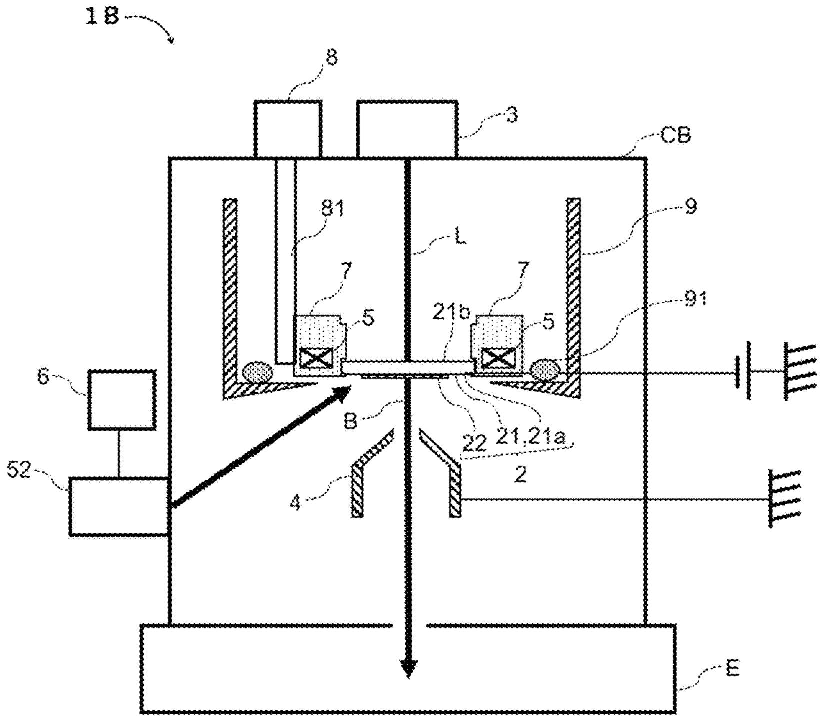
FIG. 3 is a diagram schematically illustrating an electron gun 1B according to a second embodiment and the counterpart device E to which the electron gun 1B is mounted.

An electron gun, an electron beam applicator, and an emission method of an electron beam will be described below in detail with reference to the drawings. Note that, in the present specification, members having the same type of functions are labeled with the same or similar references. Further, duplicated description for the members labeled with the same or similar references may be omitted.

Further, the position, size, range, or the like of respective components illustrated in the drawings may be depicted differently from the actual position, size, range, or the like for easier understanding. Thus, the disclosure in the present application is not necessarily limited to the position, size, range, or the like disclosed in the drawings.

First Embodiment of Electron Gun

An electron gun 1A according to the first embodiment will be described with reference to FIG. 1 and FIGS. 2A-2B. FIG. 1 is a diagram schematically illustrating the electron gun 1A according to the first embodiment and a counterpart device E to which the electron gun 1A is mounted. FIG. 2A and FIG. 2B are diagrams illustrating other embodiments for the arrangement of a heater device 5.

The electron gun 1A according to the first embodiment includes at least a photocathode 2, a light source 3, an anode 4, the heater device 5, and an output adjustment device 6.

In the example illustrated in FIG. 1, the photocathode 2 is formed by adhering a photocathode film 22 to a first face 21*a* of a substrate 21. Further, in the example illustrated in FIG. 1, in response to receiving excitation light L incident from a second face 21*b* side opposite to the first face 21*a* on which the photocathode film 22 is formed, an electron beam B is emitted from the photocathode film 22. Thus, it is desirable that the substrate 21 be a transparent substrate 21. The transparent substrate 21 is not particularly limited as long as it can transmit excitation light from the light source 3. For example, quartz glass or sapphire glass may be used. Note that, when the first face 21*a* side of the substrate 21 is irradiated with the excitation light L from the light source 3, the substrate 21 is not required to be transparent, and may be formed of a material other than quartz glass or sapphire glass as long as it can adhere the photocathode film 22.

The photocathode film 22 is not particularly limited as long as it can emit an electron beam by being irradiated with excitation light, and the material thereof may be a material requiring EA surface treatment, a material not requiring EA surface treatment, or the like. FIG. 2A illustrates an example with a material requiring EA surface treatment. The material requiring EA surface treatment may be, for example, Group III-V semiconductor materials or Group II-VI semiconductor materials. Specifically, the material may be AlN, $Ce_2Te$, GaN, a compound of one or more types of alkaline metals and Sb, or AlAs, GaP, GaAs, GaSb, InAs, or the like, and a mixed crystal thereof, or the like. The material may be a metal as another example and specifically may be Mg, Cu, Nb, $LaB_6$, $SeB_6$, Ag, or the like. The EA surface treatment is performed on the surface of a photocathode film base material 22*a* that requires the EA surface treatment, and thereby the photocathode film 22 having an EA surface 22*b* formed on the photocathode film base material 22*a* can be fabricated. For the photocathode film 22, suitable selection of the semiconductor material or the structure thereof makes it possible not only to select excitation light in a range of near-ultraviolet to infrared wavelengths in accordance with gap energy of the semiconductor but also to achieve electron beam source performance (quantum yield, durability, monochromaticity, time response, spin polarization) suitable for respective uses of the electron beam.

Further, FIG. 2B illustrates an example with the material not requiring EA surface treatment. The material not requiring EA surface treatment may be, for example, a single metal, an alloy, or a metal compound of Cu, Mg, Sm, Tb, Y, or the like or diamond, WBaO, $Cs_2Te$, or the like. The photocathode film 22*c* not requiring EA surface treatment can be fabricated by a known method (for example, see Japanese Patent No. 3537779 or the like).

The light source 3 is not particularly limited as long as it can irradiate the photocathode 2 with the excitation light L to cause emission of an electron beam B. The light source 3 may be, for example, a high power (watt class), high frequency (several hundred MHz), ultrashort pulse laser light source, a relatively inexpensive laser diode, an LED, or the like. The excitation light L for irradiation can be either pulse light or continuous light and can be adjusted as appropriate in accordance with the purpose. Note that, although the light source 3 is arranged outside the vacuum chamber CB and the excitation light L is emitted from the second face 21*b* side of the photocathode 2 in the example illustrated in FIG. 1, the light source 3 may be alternatively arranged inside the vacuum chamber CB.

The anode 4 is not particularly limited as long as it can generate an electric field together with the cathode 2, and an anode generally used in the field of electron guns can be used.

In the example illustrated in FIG. 1, the photocathode 2 and the anode 4 are arranged inside the vacuum chamber CB. Electrons in the photocathode 2 are excited by the excitation light L, and the excited electrons are emitted from the photocathode 2. The electric field generated by the anode 4 and the cathode 2 causes the emitted electrons to form the electron beam B. Note that, regarding the reference to "photocathode" and "cathode" in the present specification, "photocathode" may be used when the reference in question means emission of an electron beam B, and "cathode" may be used when the reference in question means the counter electrode of an "anode". Regarding the reference numeral, "2" is used for both of "photocathode" and "cathode".

There is no particular restriction on the arrangement of the power supply as long as the electron beam B can be emitted from the cathode 2 to the anode 4. In the example illustrated in FIG. 1, the power supply is arranged so that an electric potential difference occurs between the cathode 2 and the anode 4, and thereby an electric field can be generated.

The heater device 5 is used for heating the photocathode film 22 and/or the substrate 21. As illustrated in Examples described later, in irradiation of the photocathode film 22 with the excitation light L for emission of the electron beam B, the irradiation of the excitation light L with the photocathode 2 (the photocathode film 22) being heated extends the lifetime of the photocathode 2, in other words, slows the deterioration rate of the photocathode film 22.

The heater device 5 is not particularly limited as long as it can heat the photocathode film 22 during emission of the electron beam B. Further, the heater device 5 may directly heat the photocathode film 22 or may indirectly heat the photocathode film 22 by directly heating the substrate 21. Furthermore, the heater device 5 may heat the photocathode film 22 in a more indirect manner by indirectly heating the substrate 21.

In the example illustrated in FIG. 1, the heater device 5 is incorporated in a holder 7 that holds the substrate 21. The heater device 5 may be, for example, a heater that can generate heat by current conduction, such as an electrical resistance heater, or a high-frequency heater device. In the example illustrated in FIG. 1, the heater device 5 is incorporated in the holder 7 and heats the holder 7 to heat the substrate 21, and the heated substrate 21 heats the photocathode film 22. That is, the heater device 5 indirectly heats the substrate 21 and the photocathode film 22. It is therefore preferable that the holder 7 be formed of a material with good thermal conductivity. The material may be, for example, titanium, molybdenum, an alloy thereof, a metal such as Inconel, stainless steel (SUS), or the like.

Note that, in the example illustrated in FIG. 1, the ends of the heater device 5 and the substrate 21 are not in contact with each other. Alternatively, the heater device 5 may be arranged to be in direct contact with the substrate 21. Further, although illustration is omitted in FIG. 1, a condenser lens may be arranged to the holder 7 when the holder 7 is included. When the condenser lens is provided, it is possible to irradiate the photocathode film 22 while collecting the excitation light L from the light source 3. Therefore, when the condenser lens is provided, an electron beam B having a smaller size and a higher intensity can be emitted from the photocathode film 22.

When the photocathode film 22 has deteriorated, the photocathode 2 is heated to restore the photocathode film 22. Note that, in the present specification, restoration of the photocathode film 22 means (1) to clean the EA surface 22*b* by heating and retreat the same (reform an EA surface) with a surface treatment material described later when using the photocathode film base material 22*a* requiring EA surface treatment and (2) to remove contaminants deposited to the surface of the photocathode film 22*c* by heating when using the photocathode film 22*c* not requiring EA surface treatment. In the electron gun 1A according to the first embodiment, the heater device 5 can be used both for restoration of the photocathode film 22 and for extension of the lifetime of the photocathode 2.

The temperature in restoring the photocathode film 22 will be significantly elevated, though differing in accordance with the composition (crystal structure) of the photocathode film 22. However, an excessively high heating temperature of the photocathode 2 (the photocathode film 22) when emitting the electron beam B may destroy the photocathode film 22. Therefore, the temperature for heating the photocathode film 22 and/or the substrate 21 during emission of the electron beam B will be lower than the temperature in restoring the photocathode film 22.

Thus, the electron gun 1A according to the first embodiment includes the output adjustment device 6 for adjusting the heating temperature applied by the heater device 5 so that the photocathode 2 can be heated at different temperatures. For example, when the heater device 5 is an electrical resistance heater, the output adjustment device 6 can control the value of current output to the electrical resistance heater.

In the case of a high-frequency heater device, the output adjustment device 6 can control alternating current output to the coil of the high-frequency heater device.

The lower limit of the heating temperature of the photocathode film 22 during emission of the electron beam B may be any temperature that is higher than room temperature, such as, for example, 50° C. or higher, 75° C. or higher, 100° C. or higher, 120° C. or higher, 140° C. or higher, 160° C. or higher, 180° C. or higher, or the like, and may be adjusted as appropriate in accordance with the material forming the photocathode film 22. Further, the upper limit of the heating temperature of the photocathode film 22 during emission of the electron beam B may be any temperature at which the photocathode film 22 is not destroyed due to heating, in other words, may be any temperature that is lower than the temperature in restoration of the photocathode film 22. Although differing due to the composition and the crystal structure of the photocathode film 22, this temperature may be, for example, 600° C. or less, 550° C. or less, 500° C. or less, 450° C. or less, 300° C. or less, 250° C. or less, 200° C. or less, or the like.

The output adjustment device 6 can adjust the output of the heater device 5 that directly or indirectly heats the photocathode film 22 so that the photocathode film 22 (the photocathode 2) is within the temperature range described above. As described above, the heater device 5 can switch the output between at least two temperatures, namely, the temperature for restoring the photocathode film 22 and the temperature suitable for emission of the electron beam B. Therefore, it can be said that the output adjustment device 6 is a device that can supply at least two types of output having different power to the heater device 5. Although illustration is omitted in FIG. 1, the output adjustment device 6 and the heater device 5 can be connected to each other via wirings or the like.

Further, as for the electron gun 1A according to the first embodiment illustrated in FIG. 1, an example is illustrated in which a drive device 8 for moving the holder 7 vertically relative to a traveling direction of the electron beam B, a housing container 9 for housing the photocathode 2, and a surface treatment material 91 used for performing EA surface treatment on the photocathode 2 inside the housing container 9 are optionally, additionally arranged. When the drive device 8 includes an in-vacuum chamber drive unit 81, the output adjustment device 6 and the heater device 5 may be connected via the in-vacuum chamber drive unit 81. The drive device 8 is not particularly limited as long as it can move the photocathode 2 (move the photocathode 2 via the holder 7 in the example illustrated in FIG. 1). For example, the drive device disclosed in International Publication No. 2015/008561 or International Publication No. 2018/186294 can be used. The contents disclosed in International Publication No. 2015/008561 and International Publication No. 2018/186294 are incorporated in the present specification.

There is no particular restriction on the material of the housing container 9, and the housing container 9 can be formed of a heat resistant material that can withstand heat of 300° C. or higher, more preferably 400° C., such as glass, molybdenum, ceramic, sapphire, titanium, tungsten, tantalum, or the like, for example.

The surface treatment material 91 arranged inside the housing container 9 is not particularly limited as long as it is a material that enables EA surface treatment. The element forming the surface treatment material 91 may be, for example, Li, Na, K, Rb, Cs, Te, Sb, or the like. Note that Li, Na, K, Rb, and Cs out of the above elements will spontaneously ignite by itself and are unable to be stored and utilized. Thus, Li, Na, K, Rb, and Cs are required to be used in a form of a composite element of the above element or a compound containing the above element. On the other hand, when the element is used in a form of a compound, it is required to prevent an impurity gas from emitting during deposition of the element. Therefore, when the element selected from Li, Na, K, Rb, and Cs is used as the surface treatment material 91, it is preferable to combine and use a compound such as $Cs_2CrO_4$, $Rb_2CrO_4$, $Na_2CrO_4$, or $K_2CrO_4$ and a reducing agent that suppresses emission of an impurity gas. The surface treatment material 91 is vaporized inside the housing container 9 by using a heating unit and deposited on the photocathode 2.

In the example illustrated in FIG. 1, an example in which the heater device 5 is arranged to the holder 7 is illustrated. In contrast, in examples illustrated in FIG. 2A and FIG. 2B, examples in which the heater device 5 is directly arranged to and heats the substrate 21 without the use of the holder 7 for holding the substrate 21 are illustrated.

In the example illustrated in FIG. 2A, an example in which the heater device 5 is directly arranged to the substrate 21 is illustrated. When the heater device 5 is directly arranged to the substrate 21, an adhesive agent having a heat resistance against a temperature higher than the upper limit of the heating temperature of the heater device 5, such as an inorganic adhesive agent, for example, can be used to adhere the heater device 5 to the substrate 21. Note that, although the example in which the heater device 5 is arranged on top side of the substrate 21 has been illustrated in the example of FIG. 2A, the heater device 5 may be arranged on the side of or bottom side of the substrate 21.

In the example illustrated in FIG. 2B, an example in which a clamping member 51 for the heater device 5 is provided in order to more firmly hold the heater device 5 to the substrate 21 is illustrated. The clamping member 51 can clamp the substrate 21 and the heater device 5 and is not particularly limited as long as it has heat resistance. For example, the material forming the holder 7 can be used to fabricate the clamping member 51 having substantially a recessed shape.

Further, in the examples illustrated in FIG. 2A and FIG. 2B, the examples in which a rod 23 for vertically moving the photocathode 2 is formed to the substrate 21 are illustrated. In the examples illustrated in FIG. 2A and FIG. 2B, the photocathode 2 can be vertically driven by engagement of the in-vacuum chamber drive unit 81 of the drive device 8 illustrated in FIG. 1 with the rod 23. Further, when the second face 21*b* side of the substrate 21 is irradiated from the light source 3, the rod 23 can be formed of a transparent material or a hollow member through which the excitation light L can pass.

Second Embodiment of Electron Gun

An electron gun 1B according to the second embodiment will be described with reference to FIG. 3. FIG. 3 is a diagram schematically illustrating the electron gun 1B according to the second embodiment and the counterpart device E to which the electron gun 1B is mounted.

The electron gun 1B according to the second embodiment differs from the electron gun 1A according to the first embodiment in that a heater device 52 arranged outside the vacuum chamber CB and configured to heat the photocathode film 22 and/or the substrate 21 from outside of the vacuum chamber CB is provided and in that the heater device 5 and the output adjustment device 6 of the electron gun 1A according to the first embodiment are optional, additional features, and other features are the same as those in the first embodiment. Therefore, in the second embodiment, features different from those in the first embodiment will be mainly described, and duplicated description for the features that have already been described in the first embodiment will be omitted. Thus, it is apparent that, even when not explicitly described in the second embodiment, any feature that has already been described in the first embodiment can be employed in the second embodiment.

The heater device 52 provided to the electron gun 1B according to the second embodiment heats the photocathode film 22 and/or the substrate 21 from outside of the vacuum chamber CB. Thus, the heater device 52 is not particularly limited as long as it is a heater device that can heat a distant heating target, and may be a lamp heater, a laser heater, a high-frequency heater device, an electrical resistance heater, or the like.

In the electron gun 1B according to the second embodiment, the heater device 52 is not used for the purpose of restoring the photocathode 2 but used for the purpose of extending the lifetime of the photocathode 2. Therefore, since the heater device 52 may be driven by one type of output that has been set in advance, the output adjustment device 6 is not essential in the electron gun 1B according to the second embodiment. However, this does not mean exclusion of heating the photocathode film 22 and/or the substrate 21 at two or more different temperatures for the purpose of extending the lifetime of the photocathode 2. Therefore, the electron gun 1B according to the second embodiment may optionally, additionally include the output adjustment device 6 that adjusts the output of the heater device 52. When the heater device 52 is a lamp heater, a laser heater, or the like, the output adjustment device 6 can adjust the value of current for adjusting the power of the lamp heater, the laser heater, or the like. When the heater device 52 is an electrical resistance heater, the output adjustment device 6 can control the value of current output to the electrical resistance heater. When the heater device 52 is a high-frequency heater device, the output adjustment device 6 can control alternating current output to the coil of the high-frequency heater device. Further, in the case of the electron gun 1B according to the second embodiment, by using a lamp heater, a laser heater, an electrical resistance heater, a high-frequency heater device, or the like, the photocathode film 22 may be directly heated from outside of the vacuum chamber CB, or the substrate 21 may be heated and thereby the photocathode film 22 may be heated via the substrate 21.

Note that, in the electron gun 1B according to the second embodiment, the heater device 5 for restoration of the photocathode 2 is not essential as a solution to achieve the object of the present application. However, the electron gun 1B according to the second embodiment may optionally, additionally include the heater device 5.

The case of the electron gun 1A according to the first embodiment achieves an advantageous effect that the heater device 5 can be shared for restoration of the photocathode 2 and for extension of the lifetime of the photocathode 2. On the other hand, in the case of the electron gun 1B according to the second embodiment, the heater device 52 that is more frequently used than the heater device 5 for restoration of the photocathode 2 can be arranged outside the vacuum chamber CB. Therefore, the electron gun 1B according to the second embodiment achieves an advantageous effect that the heater device 52 can be replaced without the vacuum chamber CB being opened even when the heater device 52 fails.

Third Embodiment of Electron Gun

Figure 4:
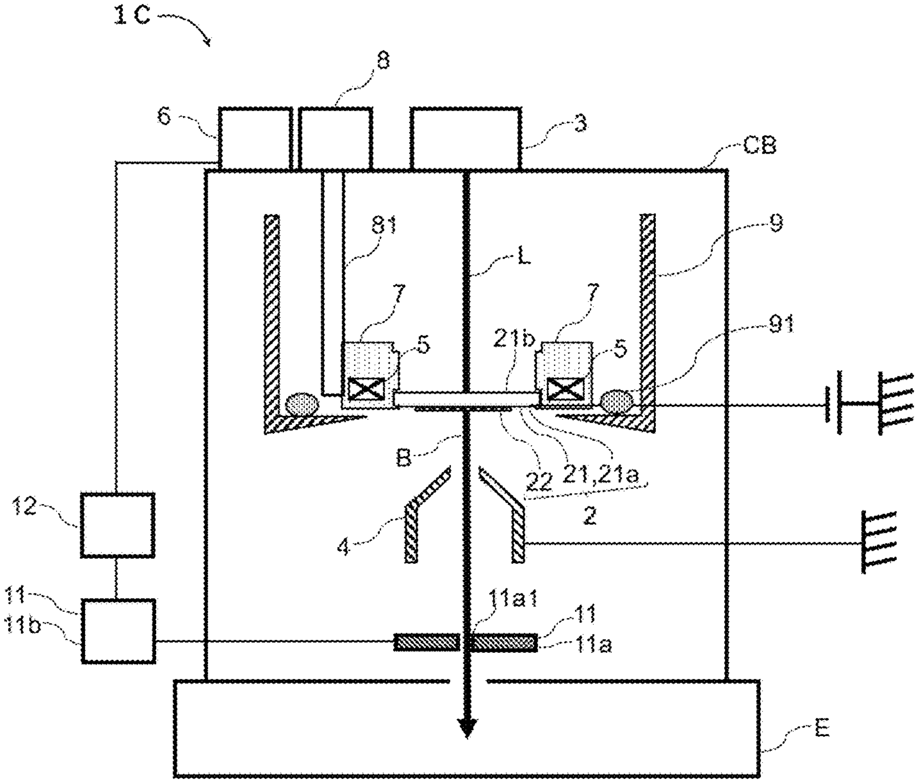
FIG. 4 is a diagram schematically illustrating an electron gun 1C according to a third embodiment and the counterpart device E to which the electron gun 1C is mounted.
Figure 5:
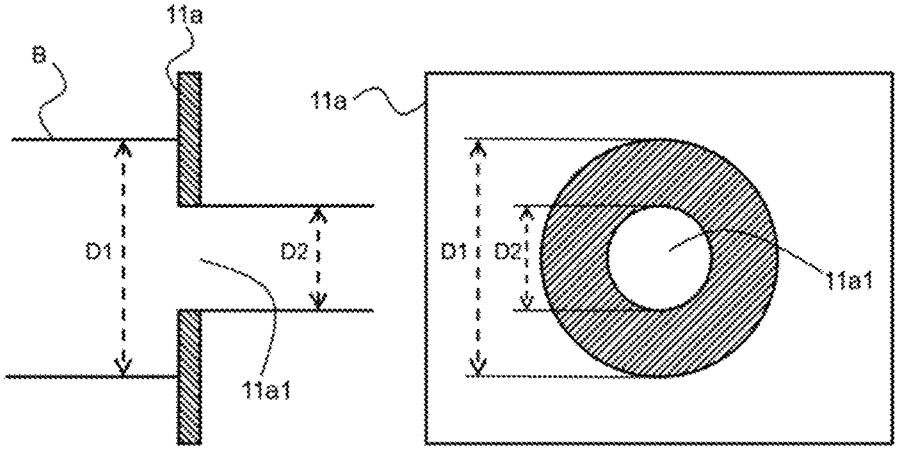
FIG. 5 is a diagram illustrating an overview of an electron beam shield member.

An electron gun 1C according to the third embodiment will be described with reference to FIG. 4 and FIG. 5. FIG. 4 is a diagram schematically illustrating the electron gun 1C according to the third embodiment and the counterpart device E to which the electron gun 1C is mounted. FIG. 5 is a diagram illustrating an overview of an electron beam shield member 11*a*.

The electron gun 1C according to the third embodiment differs from the electron gun 1A according to the first embodiment and the electron gun 1B according to the second embodiment in that a measuring unit 11 that measures a change in the intensity of the electron beam B emitted from the photocathode 2 due to deterioration of the photocathode 2 and a control unit 12 that controls the output adjustment device 6 in accordance with a measurement result from the measuring unit 11 are provided, and other features are the same as those in the above embodiments. Therefore, in the third embodiment, features different from those in the first embodiment and the second embodiment will be mainly described, and duplicated description for the features that have already been described in the first embodiment and the second embodiment will be omitted. Thus, it is apparent that, even when not explicitly described in the third embodiment, any feature that has already been described in the first embodiment and the second embodiment can be employed in the third embodiment.

In the example illustrated in FIG. 4, the measuring unit 11 is formed of the electron beam shield member 11*a* and a measuring instrument 11*b* arranged inside the electron gun 1C. Further, the control unit 12 that controls the output adjustment device 6 in accordance with a measurement result from the measuring unit 11 is provided.

The electron beam shield member 11*a* includes a hole 11*a*1 through which a part of the electron beam B emitted from the photocathode 2 passes. The width of the hole 11*a*1 is smaller than the width of the electron beam B. As illustrated in FIG. 5, the width of the electron beam B when reaching the electron beam shield member 11*a* is denoted as D1, and the width of the hole 11*a*1 is denoted as D2. In the electron beam B, a portion overlapping the hole 11*a*1 passes through the electron beam shield member 11*a*. On the other hand, in the electron beam B, a difference, namely, a portion not passing through the hole 11*a*1 is blocked by the electron beam shield member 11*a*. The electron beam blocked by the electron beam shield member 11*a* is then used as a "measuring electron beam", and the intensity is measured by the measuring instrument 11*b*. Note that there is no particular restriction on the size of D2 as long as a desired amount of an electron beam can pass through. Further, there is no particular restriction on the size of D1 relative to D2 as long as a measuring electron beam that can be measured by the measuring instrument 11*b* can be obtained. While a larger D1 relative to D2 causes a larger amount of the measuring electron beam and improves measuring accuracy at the measuring instrument 11*b*, the amount of an electron beam entering the counterpart device E out of the electron beam B emitted from the photocathode 2 is reduced, and this results in lower operation efficiency of the electron beam applicator. In contrast, an excessively small D1 relative to D2 reduces the amount of the measuring electron beam, and this results in lower measurement accuracy at the measuring instrument 11*b*. Therefore, the size of D1 and D2 can be adjusted as appropriate taking the measurement accuracy and the operation efficiency into consideration.

The material of the electron beam shield member 11*a* is not particularly limited as long as it is a conductor or a semiconductor. For example, in a case of a conductor, the material may be a metal such as stainless steel (SUS), copper, or the like.

The measuring instrument 11*b* measures the intensity of the electron beam B by using the measuring electron beam that is a part of the electron beam B blocked by the electron beam shield member 11*a*. The measuring instrument 11*b* is not particularly limited as long as it can measure the intensity of the electron beam B. For example, when the electron beam shield member 11*a* is a conductor, a measuring electron beam causes current to occur between the electron beam shield member 11*a* and the measuring instrument 11*b*. Thus, the intensity of the electron beam B can be measured as a value of current at the measuring instrument 11*b*. Note that the value of current can be measured by using a known ammeter. Further, since the measured value of current depends on the intensity of the electron beam B, monitoring of a change in the value of current enables monitoring of a change in the intensity of the electron beam B. Further, it is also possible to use a semiconductor as the electron beam shield member 11*a* and measure the value of current occurring in response to the measuring electron beam hitting the semiconductor.

Further, the measuring instrument 11*b* may measure the intensity of the electron beam B by a fluorescent intensity instead of a value of current. More specifically, a conductor to which a fluorescent material has been applied in advance may be used as the electron beam shield member 11*a*, and the fluorescent intensity of light emitted in response to a measuring electron beam hitting the fluorescent material may be measured by the measuring instrument 11*b*. Note that a fluorescent intensity can be measured by using a known fluorophotometer.

As disclosed in Patent Literature 2, it is known to use the electron beam shield member 11*a* to measure a change in the intensity of the electron beam B emitted from the photocathode 2 due to deterioration of the photocathode 2, adjust the intensity of the light source 3 or the like in accordance with a measurement result from the measuring unit 11, and thereby adjust intensity of the electron beam B emitted from the photocathode 2. In contrast, the control performed by the electron gun 1C according to the third embodiment differs from the control disclosed in Patent Literature 2 in that the control unit 12 controls the output adjustment device 6 in accordance with a measurement result from the measuring unit 11 and thereby adjusts the temperature of the photocathode 2.

Figure 6:
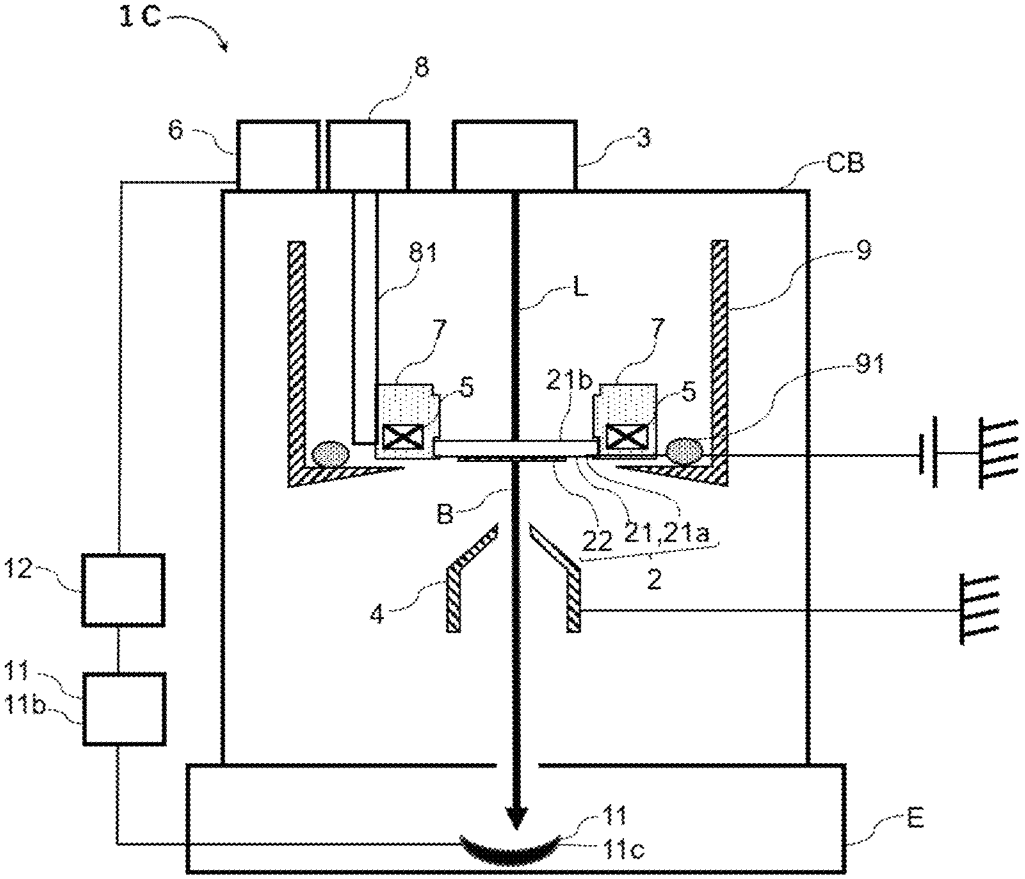
FIG. 6 is a diagram illustrating another example of a measuring unit in the electron gun 1C according to the third embodiment.

Note that, although FIG. 4 and FIG. 5 illustrate an example in which the measuring unit 11 is formed of only the configuration provided to the electron gun 1C, the measuring unit 11 is not limited to the example illustrated in FIG. 4 and FIG. 5 as long as it can measure deterioration of the photocathode 2. For example, FIG. 6 illustrates another example of the measuring unit 11. In the example illustrated in FIG. 6, instead of the electron beam shield member 11*a*, a Faraday cup 11*c* is provided to the counterpart device E, and the measuring unit 11 can be formed of an ammeter 11*b* along with the electron beam B captured by the Faraday cup 11*c*.

Further, although illustration is omitted, the measuring unit 11 may be formed of a member such as an aperture that is provided to the electron gun 1C or the counterpart device E and blocks the electron beam B and the ammeter (measuring instrument) 11*b* in combination. Alternatively, since there is a correlation between the light amount of the light source 3 and the intensity of the electron beam B, the measuring unit 11 may be formed of a measuring instrument that measures leak current from the electron gun 1C (or the counterpart device E) and a calculation unit that calculates a change in the intensity of the electron beam B in accordance with the ratio of leak current relative to a light amount. Further alternatively, the measuring unit 11 may be formed of an ammeter that measures current supplied to the photocathode 2 from an acceleration power supply accelerating the electron beam B.

The electron gun 1C according to the third embodiment includes the control unit 12, and this enables the following control presented as an example, for example.

(1) The photocathode 2 is not heated when starting emission of the electron beam B and then heating of the photocathode 2 by the heater device 5 may be performed by starting the heating of the photocathode 2 in accordance with the measurement result from the measuring unit 11.

In such a case, the load and running cost of the heater device 5 can be reduced.

(2) The heating temperature of the photocathode 2 is changed in accordance with the measurement result of the measuring unit 11.

Further, the control unit 12 of the electron gun 1C according to the third embodiment may adjust the intensity of the electron beam B emitted from the photocathode 2 as needed in addition to the control of the output adjustment device 6. In such a case, for example, the following control presented as an example is possible.

(1) When the intensity of the electron beam B decreases, the light source 3 or the like may be adjusted first to adjust the intensity of the electron beam B, and after further adjustment of the light source 3 or the like becomes difficult, heating of the photocathode 2 by the heater device 5 may be performed.

In such a case, the load and running cost of the heater device 5 can be reduced.

(2) The control of the light source 3 or the like and the heating control by the heater device 5 may be performed in combination.

Note that adjustment of the intensity of an electron beam is disclosed in Patent Literature 2. The content disclosed in Patent Literature 2 (Japanese Patent No. 6578529) is incorporated in the present specification.

Embodiment of Electron Beam Applicator

The electron beam applicator to which the electron gun 1A, 1B or 1C is mounted may be a known device to which the electron gun 1A, 1B or 1C is mounted. For example, the electron beam applicator may be a free electron laser accelerator, an electron microscope, an electron holography device, an electron beam drawing device, an electron diffractometer, an electron beam inspection device, an electron beam metal additive manufacturing device, an electron beam lithography device, an electron beam processing device, an electron beam curing device, an electron beam sterilization device, an electron beam disinfection device, a plasma generation device, an atomic element generation device, a spin-polarized electron beam generation device, a cathodoluminescence device, an inverse photoemission spectroscopy device, or the like.

Embodiment of Emission Method of Electron Beam

An emission method of an electron beam includes, with use of the electron gun 1A, 1B, 1C or the electron beam applicator according to any of the first to third embodiments, an electron beam emission step of irradiating the photocathode 2 with the excitation light L from the light source 3 while heating the photocathode film 22 and/or the substrate 21 and emitting the electron beam B from the photocathode 2 in response to receiving the excitation light L.

The emission method of an electron beam may perform a photocathode temperature adjustment step of adjusting the heating temperature of the photocathode film 22 and/or the substrate 21 as needed. The photocathode temperature adjustment step can switch the output of the heater device 5 by using the output adjustment device 6. The output to the heater device 5 from the output adjustment device 6 may be switched by an operator at any timing. Alternatively, the output to the heater device 5 from the output adjustment device 6 may be switched in accordance with a measurement result from the measuring unit 11 that measures a change in the intensity of the electron beam B emitted from the photocathode 2 due to the deterioration of the photocathode 2.

While Examples are presented below to specifically describe the embodiment disclosed in the present application, these Examples are only for the purpose of illustration of the embodiment. The Examples neither limit the scope of the invention disclosed in the present application nor express restriction.

EXAMPLES

Example 1

A laser light source (iBeamSmart by Toptica) was used for the light source 3. An InGaN photocathode was fabricated as the photocathode 2 by a known method disclosed in Daiki SATO et al. 2016 Jpn. J. Appl. Phys. 55 05FH05. EA treatment on the photocathode surface was performed by a known method. The electron beam shield member 11*a* was fabricated by using stainless steel. Further, an electrical resistance heater made of tantalum was used for the heater device 5 and arranged so that the heater device 5 is in contact with the substrate 21. Further, the temperature of the photocathode 2 when a predetermined amount of current is conducted to the heater device 5 was measured in advance to obtain the correlation between the temperature and a value of current required when the photocathode 2 is adjusted at a desired temperature.

The photocathode 2 was caused to emit the electron beam B by irradiating the photocathode 2 with excitation light from the light source 3 and applying an acceleration voltage of 30 kV between the photocathode 2 and the anode 4. The value of current of a measuring electron beam acquired by the electron beam shield member 11*a* was then acquired by measuring and converting the voltage between both ends of a shunt resistor of 100 kΩ by using a data logger (MW100 by Yokogawa Electric Corporation). The measurement was performed every 1 second. The result of the value of current measured by the measuring unit 11 was fed back to the light source 3 every 5 seconds so that the value of current measured by the measuring unit 11 becomes approximately $2\times10^{-5}$ A. Further, current was conducted to the heater device 5 for heating so that the temperature of the photocathode 2 becomes about 100° C. at the same time as irradiation of the excitation light L. The measurement result is illustrated in FIG. 7A.

Comparative Example 1

An experiment was made by the same procedure as in Example 1 except that the heater device 5 was not heated and the photocathode 2 was irradiated with the excitation light L at room temperature (about 27° C.). The measurement result is illustrated in FIG. 7B.

Figure 7A:
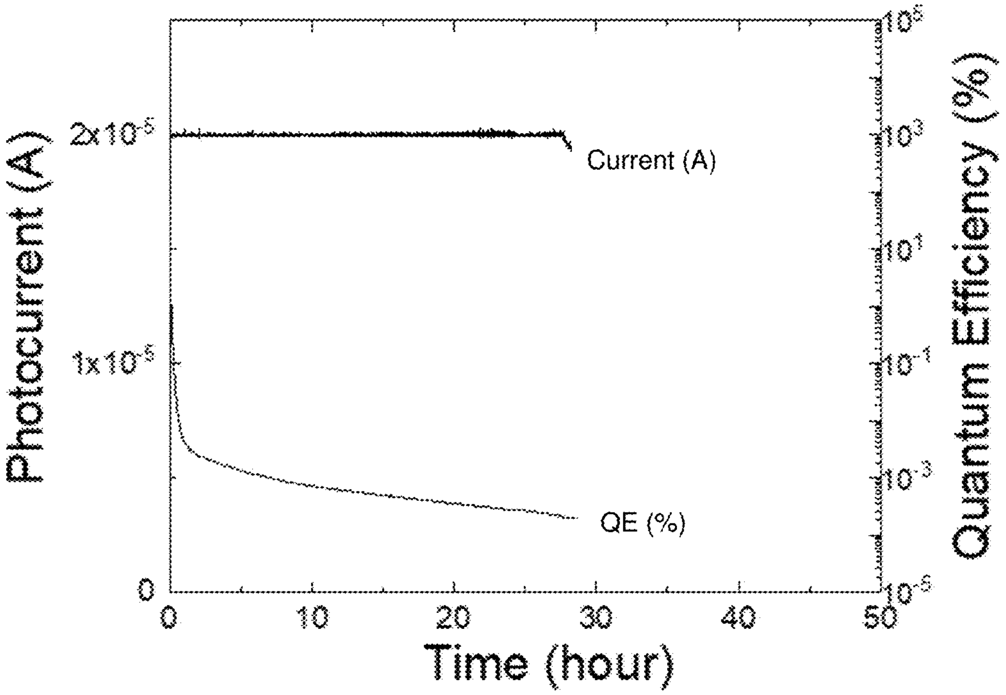
FIG. 7A is a diagram illustrating a measurement result of Example 1.
Figure 7B:
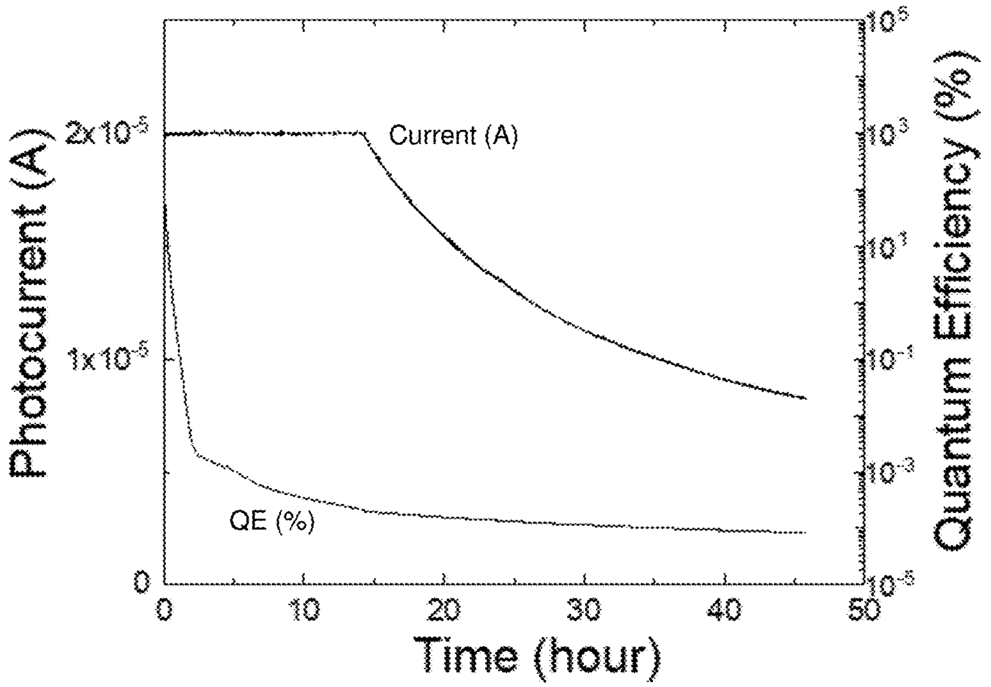
FIG. 7B is a diagram illustrating a measurement result of Comparative example 1.

As illustrated in FIG. 7A, when the electron beam B was emitted with the photocathode 2 being heated at about 100° C., a stable electron beam B was emitted for about 28 hours. On the other hand, as illustrated in FIG. 7B, when the electron beam B was emitted without the photocathode 2 being heated, a stable electron beam B was emitted for about 14 hours. In general, it is expected that heating the photocathode 2 during emission of an electron beam will increase energy dispersion of the electron beam B. Therefore, even those skilled in the art would not consider causing emission of the electron beam B while heating the photocathode 2. In the disclosure in the present application, it was confirmed to achieve an advantageous effect that it is possible to extend the lifetime of the photocathode 2 (extend the period in which a stable electron beam B can be generated) by causing emission of the electron beam B while heating the photocathode 2, which would otherwise not be expected even by those skilled in the art.

Example 2

An experiment was made by the same procedure as in Example 1 except that GaAs was used instead of the InGaN photocathode. GaAs was fabricated by molecular beam epitaxy (MBE). The measurement result is illustrated in FIG. 8A.

Comparative Example 2

An experiment was made by the same procedure as in Comparative example 1 except that GaAs was used instead of the InGaN photocathode. The measurement result is illustrated in FIG. 8B.

Figure 8A:
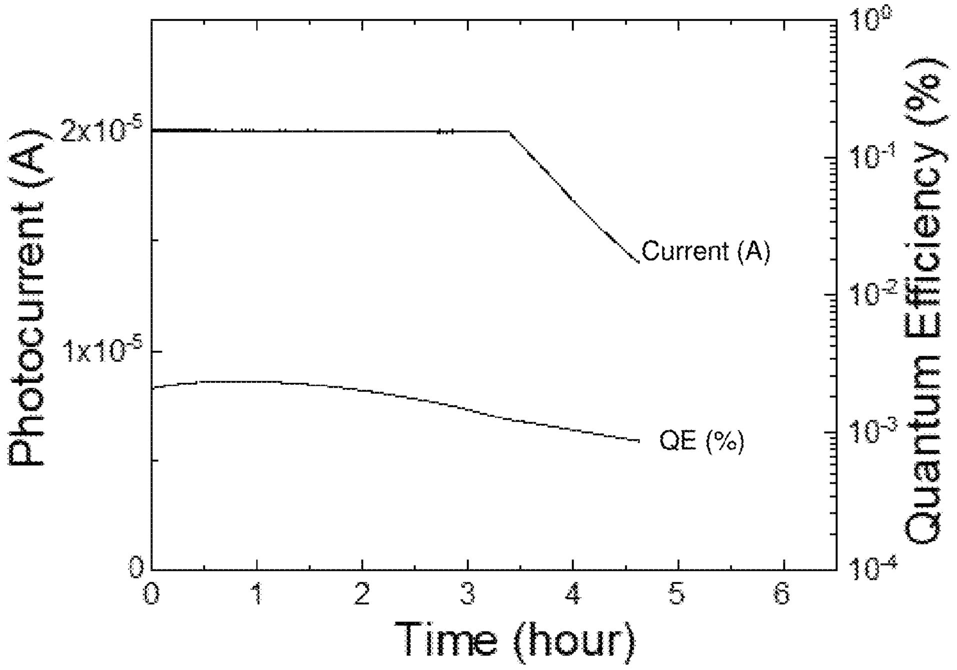
FIG. 8A is a diagram illustrating a measurement result of Example 2.
Figure 8B:
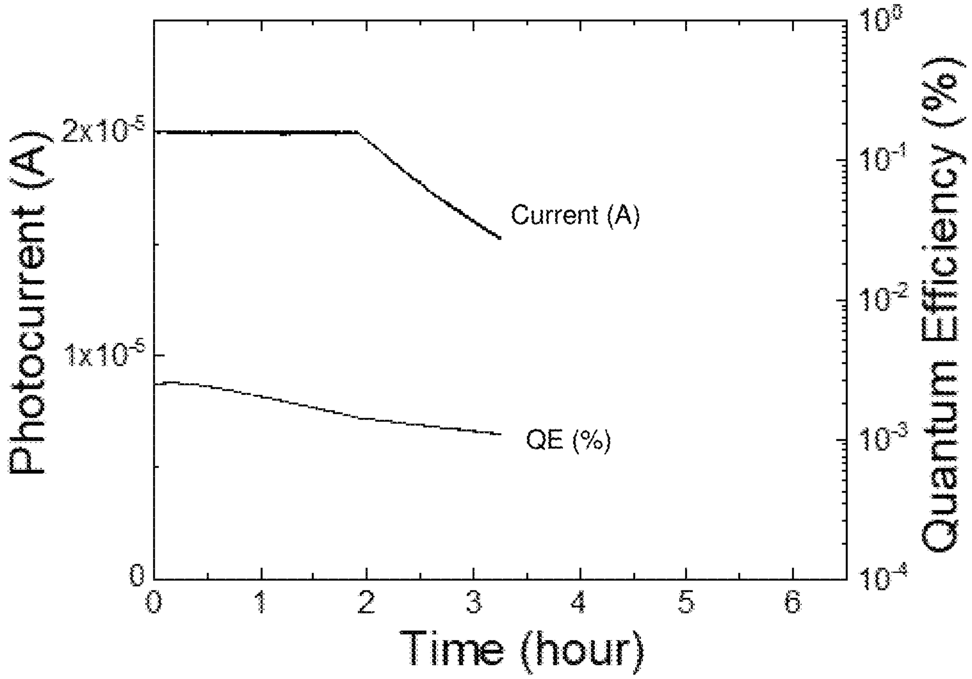
FIG. 8B is a diagram illustrating a measurement result of Comparative example 2.

As illustrated in FIG. 8A, when the electron beam B was emitted with the photocathode 2 being heated at about 100° C., a stable electron beam B was emitted for about 3.5 hours. On the other hand, as illustrated in FIG. 8B, when the electron beam B was emitted without the photocathode 2 being heated, a stable electron beam B was emitted for about 1.9 hours.

According to the above results, even when the type of the semiconductor forming the photocathode film 22 was changed, the lifetime of the photocathode 2 was extended when the electron beam B was emitted with the photocathode 2 being heated. The heat resistance temperature of the photocathode film 22 varies in accordance with the type of the semiconductor. Therefore, from the results of Examples 1 and 2, it was confirmed that the upper limit of the heating of the photocathode 2 can be set at a suitable temperature in accordance with the type of the semiconductor.

INDUSTRIAL APPLICABILITY

The use of the electron gun, the electron beam applicator, and the emission method of an electron beam disclosed in the present application can extend the lifetime of a photocathode. Therefore, the electron gun, the electron beam applicator, and the emission method of an electron beam disclosed in the present application are useful for business entities that handle an electron gun.

LIST OF REFERENCES 1A, 1B, 1C electron gun 2 photocathode, cathode

21 substrate
21*a* first face of the substrate
21*b* second face of the substrate
22 photocathode film
22*a* photocathode film base material requiring EA surface treatment
22*b* EA surface
22*c* photocathode film not requiring EA surface treatment
23 rod
3 light source
4 anode
5 heater device
51 clamping member
52 heater device
6 output adjustment device
7 holder
8 drive device
81 in-vacuum chamber drive device
9 housing container
91 surface treatment material
11 measuring unit
11*a* electron beam shield member
11*a*1 hole
11*b* measuring instrument
11*c* Faraday cup
12 control unit
B electron beam
CB vacuum chamber
D1 width of an electron beam
D2 width of the hole
E counterpart device
L excitation light

The invention claimed is:

1. An emission method of an electron beam, wherein the electron beam is emitted from an electron gun including a substrate having a semiconductor photocathode film formed on a first face, a light source for irradiating the semiconductor photocathode film with excitation light, an anode, a heater device for heating the semiconductor photocathode film and/or the substrate, an output adjustment device that adjusts a heating temperature of the heater device, a measuring unit that measures a change in an intensity of an electron beam emitted from the semiconductor photocathode film due to deterioration of the semiconductor photocathode film, a control unit configured to control the output adjustment device in accordance with a measurement result from the measuring unit, such that the heater device heats the semiconductor photocathode film and/or the substrate to a temperature of 50° C. or higher and 250° C. or less, and a vacuum chamber;

the emission method comprising:

an electron beam emission step of irradiating the semiconductor photocathode film with the excitation light from the light source while heating the semiconductor photocathode film and/or the substrate to a temperature of 50° C. or higher and 250° C. or less and emitting an electron beam from the semiconductor photocathode film in response to receiving the excitation light, wherein the emitted electron beam travels from the semiconductor photocathode film toward the anode, both the semiconductor photocathode film and the anode are located in a vacuum environment.

2. The emission method according to claim 1 further comprising a photocathode temperature adjustment step of adjusting a heating temperature of the semiconductor photocathode film and/or the substrate.

3. The emission method according to claim 2, wherein the photocathode temperature adjustment step is performed in accordance with a measurement result from the measuring unit.

* * * * *